(12) United States Patent
Chow et al.

(10) Patent No.: US 7,202,503 B2
(45) Date of Patent: Apr. 10, 2007

(54) III-V AND II-VI COMPOUNDS AS TEMPLATE MATERIALS FOR GROWING GERMANIUM CONTAINING FILM ON SILICON

(75) Inventors: Loren Chow, Santa Clara, CA (US); Mohamad Shaheen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/883,295

(22) Filed: Jun. 30, 2004

(65) Prior Publication Data

US 2006/0001018 A1 Jan. 5, 2006

(51) Int. Cl.
*H01L 29/22* (2006.01)
*H01L 29/06* (2006.01)
*H01L 31/0328* (2006.01)

(52) U.S. Cl. .......................... 257/78; 257/19; 257/20; 257/190; 257/191; 257/192; 257/614; 257/616; 438/933

(58) Field of Classification Search ............ 257/19–20, 257/190–192, 614–616, 78; 438/752, 933
See application file for complete search history.

(56) References Cited

U.S. PATENT DOCUMENTS

| 3,963,539 A | * | 6/1976 | Kemlage et al. .............. 117/90 |
| 4,994,867 A | * | 2/1991 | Biegelsen .................... 257/190 |
| 5,183,778 A | * | 2/1993 | Takasaki ...................... 117/89 |

* cited by examiner

*Primary Examiner*—Ori Nadav
(74) *Attorney, Agent, or Firm*—Blakely, Sokoloff, Taylor & Zafman LLP

(57) ABSTRACT

An assembly comprising a semiconductor substrate having a first lattice constant, an intermediate layer having a second lattice constant formed on the semiconductor substrate, and a virtual substrate layer having a third lattice constant formed on the intermediate layer. The intermediate layer comprises one of a combination of III–V elements and a combination of II–VI elements. The second lattice constant has a value that is approximately between the values of the first lattice constant and the third lattice constant.

14 Claims, 4 Drawing Sheets

| MATERIAL | LATTICE PARAMETER (angstroms) |
|---|---|
| Si | 5.43 |
| AlP | 5.45 |
| GaP | 5.45 |
| GaAs | 5.65 |
| Ge | 5.65 |

FIGURE 4

| GROUP II | GROUP III | GROUP IV | GROUP V | GROUP VI |
|---|---|---|---|---|
| Beryllium (Be) | Boron (B) | Carbon (C) | Nitrogen (N) | Oxygen (O) |
| Magnesium (Mg) | Aluminum (Al) | Silicon (Si) | Phosphorous (P) | Sulfur (S) |
| Calcium (Ca) | Gallium (Ga) | Germanium (Ge) | Arsenic (As) | Selenium (Se) |
| Strontium (Sr) | Indium (In) | Tin (Sn) | Antimony (Sb) | Tellurium (Te) |
| Zinc (Zn) | Thallium (Tl) | Lead (Pb) | Bismuth (Bi) | Polonium (Po) |
| Cadmium (Cd) | | | | |
| Mercury (Hg) | | | | |
| | | | | |
| | | | | |

FIGURE 5

III-V AND II-VI COMPOUNDS AS TEMPLATE MATERIALS FOR GROWING GERMANIUM CONTAINING FILM ON SILICON

BACKGROUND

Embodiments of the present invention relates generally to reducing dislocations in a semiconductor structure. More particularly, the embodiments of the present invention are directed to methods of reducing dislocations in a germanium-containing layer formed on a semiconductor substrate having a dissimilar lattice constant.

Semiconductor devices often include multiple layers of conductive, insulating, and semiconductor layers. High mobility or high electron mobility is desirable in these devices. Germanium is one of the elements that has been shown to exhibit the high mobility characteristic. However, there are limited supplies of such element to satisfy the demand for high mobility substrates.

For many years, attempts have been made to grow high quality film on readily abundant substrate materials such as silicon. The high quality film can form a virtual substrate upon which semiconductor devices can be formed. Attempts have been made, for example, to grow germanium on silicon. These attempts have generally been unsuccessful because lattice mismatches between the host silicon substrate and the grown germanium comprising film, which has caused the resulting layer of germanium comprising film to be of low crystalline quality. For example, there is a difference in the lattice constant of silicon and the lattice constant of germanium. The two crystals thus have different lattice spacings and as such one atom cannot easily grow on top of another. Germanium is thus constrained by the underlying silicon substrate. When germanium is grown on silicon, the lattice spacing of germanium tends to try to match to that lattice spacing of silicon. When the germanium film is deposited to a sufficient thickness, only about 100 angstroms (or greater), the germanium layer relaxes causing dislocations (or defects) in the germanium layer.

Under many conventional methods of forming the germanium layer on a silicon substrate, a defect density of $10^9$ per cm$^2$ can be present in the germanium layer due to the dislocation formation. There are currently several techniques to reduce the dislocation (defects) in the grown germanium layer. In one example, (FIG. 1) the germanium layer is formed in a linear gradient with a steady increase of the percentage of germanium in the film from 0% to about 100%. Typically, the increase is graded at the rate of about 10% per every 1.0 μm of germanium layer. In this example, to grow a 100% germanium layer, the layer needs to be about 10.0 μm thick. Even with such a thick germanium layer, the dislocation or defects observed is still about $10^4$ to $10^5$ per cm$^2$, which is substantially undesirable. Additionally, it has become apparent that it's impractical to grow a 10.0 μm thick germanium layer, for example, due to the long amount of time needed for the deposition of germanium.

BRIEF DESCRIPTION OF THE DRAWINGS

The embodiments of the present invention are illustrated by way of example and not by way of limitation in the figures of the accompanying drawings in which like references indicate similar elements. The invention may best be understood by referring to the following description and accompanying drawings that are used to illustrate embodiments of the invention. It should be noted that references to "an" or "one" embodiment of the invention in this disclosure are not necessarily to the same embodiment, and they mean at least one. In the drawings:

FIG. 4 lists examples of lattice constants of some III-V compounds compared to silicon and germanium;

FIG. 5 illustrates exemplary elements extracted from groups II, III, IV, V, and VI of the periodic table.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Exemplary embodiments of the present invention pertain to a semiconductor substrate having a first lattice constant, an intermediate layer having a second lattice constant formed on the semiconductor substrate, and a virtual substrate layer having a third lattice constant formed on the intermediate layer. The intermediate layer comprises a combination of III-V or II-VI elements. The second lattice constant has a value that is between the values of the first lattice constant and the third lattice constant. Other exemplary embodiments of the present invention pertain to a method of forming a virtual substrate that comprises germanium wherein the germanium-containing virtual substrate is substantially defect free and therefore contains minimal dislocations. The method includes providing a semiconductor substrate having a first lattice constant, forming an intermediate layer on the substrate, and forming a germanium-containing layer on the intermediate layer. The intermediate layer comprises a combination of III-V or II-VI elements and has a second lattice constant. The germanium-containing layer has a third lattice constant. Forming the intermediate layer further comprises choosing at least one element from a group III element and choosing at least one element from a group V element such that the combination of III-V elements has the second lattice constant that is between the values of the first lattice constant and the third lattice constant. Alternatively, forming the intermediate layer further comprises choosing at least one element from a group II element and choosing at least one element from a group VI element such that the combination of II-VI elements has the second lattice constant that is between the values of the first lattice constant and the third lattice constant. The intermediate layer is chosen so that it has a lattice constant relatively similar to silicon and relatively similar to germanium containing layer so that the lattice mismatch and dislocation in the germanium-containing layer is reduced. The intermediate layer has a lattice constant that is intermediate between the lattice constants of the semiconductor substrate and the germanium-containing layer so that the intermediate layer serves to ease the transition between the semiconductor substrate and the germanium-containing layer.

Figure 1:
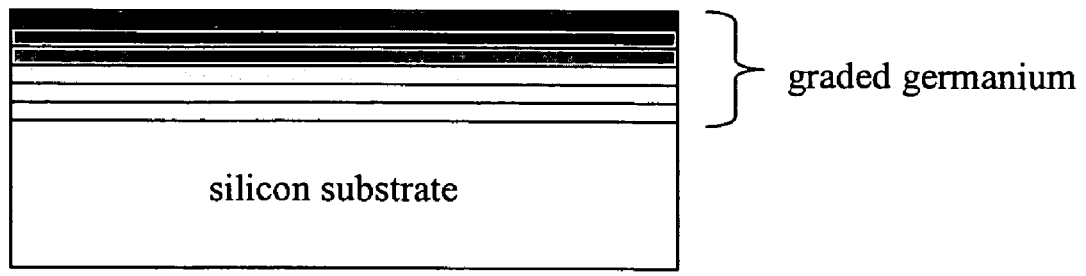
FIG. 1 illustrates an exemplary method of forming a germanium layer on a silicon substrate wherein the germanium layer is graded from 0% to 100%.
Figure 2:
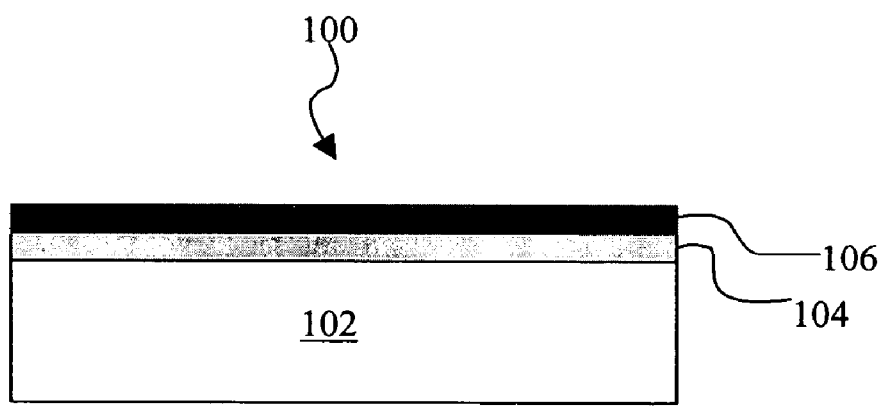
FIG. 2 illustrates an exemplary assembly of the present invention in which a germanium containing film is formed on a III-V or II-VI compound intermediate layer.

FIG. 1 illustrates schematically, in cross section, a portion of a semiconductor structure 100 in accordance with an embodiment of the present invention. The semiconductor structure 100 includes a semiconductor substrate 102, a III–V compound intermediate layer 104, and a germanium-containing layer 106. In one embodiment, the germanium-containing layer 106 is made of substantially pure germanium. In one embodiment, the substrate 102 is a wafer containing silicon and preferably, and in another embodiment, is a high qualify monocrystalline silicon wafer as used in the semiconductor industry. The silicon substrate has a relatively small number of defects such as dislocations as typically used in semiconductor fabrication. The semiconductor substrate 102 can also be another semiconductor substrate known in the art such as a silicon-on-insulator substrate, mixed silicon substrate, mixed silicon and germanium substrate, mixed silicon and carbon substrate, and the like.

The III–V compound intermediate layer 104 is positioned between the semiconductor substrate 102 and the germanium-containing layer 106. The III–V compound intermediate layer 104 helps to relieve the strain in the germanium-containing layer 106 and by doing so, aids in the growth of a high crystalline quality germanium layer. The III–V compound intermediate layer 104 serves to relieve strain that otherwise occurs in the germanium-containing layer 106 due to the lattice mismatch between the germanium and the semiconductor substrate 102, typically, a silicon substrate. As used herein, the term lattice constant refers to a constant value indicating the distance between atoms of a cell measured in the plane of the surface. If the strain is not relieved by the III–V compound intermediate layer 104 the strain can cause defects in the germanium-containing layer 106. The thickness of the III–V compound intermediate layer 104 is sufficient to relieve strain attributed to mismatches between the lattice constant of the substrate 102 and the germanium-containing layer 106. The III–V compound intermediate layer 104 may have a thickness ranging from about 0.30 nm to about 500 nm.

In one embodiment, the substrate 102 is a silicon substrate and has a lattice constant of about 5.43 angstroms; and, the germanium-containing layer 106 is a substantially pure germanium layer and has a lattice constant of about 5.65 angstroms. In this embodiment, the III–V compound intermediate layer 104 thus should have a lattice constant between about 5.43 angstroms, that of silicon, and about 5.65 angstroms, that of germanium. FIG. 4 illustrates the lattice constants for some exemplary III–V compounds compared to silicon and germanium. In one embodiment, a III–V compound intermediate layer 104 may be engineered so that it has a lattice constant value of about 5.45. For instance, the III–V compound intermediate layer 104 can be formed by combining aluminum and phosphorous to get aluminum phosphide (AlP) which has a lattice value of about 5.45 or by combining gallium and phosphorous to get gallium phosphide (GaP) which has a lattice value of about 5.45. The III–V compounds can be combined with one another to form an intermediate layer 104 with a lattice constant value that falls between that of silicon and germanium. For instance, a group III element with a high lattice constant can be combined with a group V element with a low lattice constant such that the III–V combination compound will have a lattice constant that is approximately between the lattice constant of silicon and germanium.

The III–V compound intermediate layer 104 can also be graded so that the layer 104 grows from a lattice constant near that of silicon to a lattice constant near that of germanium. Varying the composition of the compound intermediate layer 104 also serves to provide a lattice match between the substrate 102 and the germanium-containing layer 106. Grading the intermediate layer 104 may serve the ultimate purpose of easing the strain in the Ge-containing layer 106.

FIG. 5 illustrates examples of some of the III and V compounds that can be combined to form the III–V compound intermediate layer 104. The III–V compound intermediate layer 104 can be engineered so that the lattice constant of the layer 104 can be between that of silicon (about 5.43 angstroms) and that of germanium (about 5.65 angstroms) by mixing up the combination of the III and V elements. The lattice constant for the elements in the group III and V increases as one goes down in the period table. Thus, the lattice constant for aluminum is higher than boron, gallium is higher than aluminum, and indium is higher than gallium. Similarly, the lattice constant for phosphorous is higher than nitrogen, arsenic is higher than phosphorous, and antimony is higher than arsenic. Mixing the elements from group III and V thus can give a compound having a lattice constant that is between silicon and germanium such that germanium will form fewer dislocations or no dislocations when being deposited on the III–V compound intermediate layer 104. There are numerous potential mixtures of the III and V elements to create a compound that has a lattice constant between that of silicon and germanium. A few examples of III–V combination compound that may have lattice constants between silicon and germanium include aluminum indium antimony ($Al_xIn_{1-x}Sb$), aluminum indium arsenide ($Al_xIn_{1-x}As$), aluminum phosphide (AlP), aluminum arsenide (AlAs), aluminum antimony (AlSb), aluminum gallium arsenide ($Al_xGa_{1-x}As$), gallium phosphide (GaP), gallium arsenide (GaAs), gallium antimony (GaSb), gallium arsenic indium phosphide (GaAsInP), gallium arsenide gallium indium phosphide (GaAsGaP), indium phosphide (InP), indium arsenide (InAs), indium antimony (InSb), indium gallium phosphide ($In_xGa_{1-x}P$), indium gallium arsenide ($In_xGa_{1-x}As$), and indium gallium antimonide ($In_xGa_{1-x}Sb$).

The III–V compound intermediate layer 104 can be a binary system compound such as AlAs, AlSb, GaP, GaAs, GaSb, InP, InAs, and InSb. In the binary system, one element from group III and one element from group V are chosen to form the III–V compound for the layer 104. The III–V compound has a ratio of 1:1 (element III: element V).

The III–V compound intermediate layer 104 can be a ternary system compound wherein three elements selected from groups III and V are chosen to form the layer 104. Examples of a ternary system compound that can be used for the layer 104 include $Al_xIn_{1-x}Sb$, $Al_xIn_{1-x}As$, $Al_xGa_{1-x}As$, $In_xGa_{1-x}P$, $In_xGa_{1-x}As$, and $In_xGa_{1-x}Sb$. The total number of compound III is equal to the total number of compound V. The III–V compound may have a variety of ratios so long as the total elements of group III adds up to be the total elements of group V. For instance, the III–V compound may have a ratio of 50:25:25 (element III: element V: element V); 50:30:20 (element III: element V: element V; 25:25:50 (element III: element III: element V) and, 30:20:50 (element III: element III: element V).

The III–V compound intermediate layer 104 can also be a quaternary system compound wherein four elements selected from groups III and V are chosen to form the layer 104. Examples of a quaternary system compound that can be used for the layer 104 include GaAsInP and GaAsGaP. The total number of compound III is equal to the total number of compound V. The III–V compound may have a variety of ratios so long as the total elements of group III adds up to be the total elements of group V. For instance, the III–V compound may have a ratio of 50:50 (elements III: elements V) and 25:25:25:25 (element III: element III: element V: element V).

In one embodiment, the III–V compound intermediate layer 104 has a high activation energy for dislocation for instance higher than 2–3 eV. The III–V compound intermediate layer 104 also has a diamond cubic structure or a zincblende crystal structure similar to that of silicon's diamond cubic structure.

In other embodiments, instead of the III–V compound intermediate layer 104, the layer 104 is replaced by a II–VI compound intermediate layer. The combination concept of the II–VI compound is similar to that of the III–V compound combination previously discussed. FIG. 5 illustrates examples of some of the II and VI compounds that can be combined to form the II–VI compound intermediate layer. The II–VI compound intermediate layer can be engineered so that the lattice constant of the intermediate layer can be between that of silicon (about 5.43 angstroms) and that of germanium (about 5.65 angstroms) by mixing up the combination of the II and VI elements. The lattice constant for the elements in the group II and VI increases as one goes down in the period table. Thus, the lattice constant for magnesium is higher than beryllium, calcium is higher than magnesium, and strontium is higher than calcium. Similarly, the lattice constant for sulfur is higher than oxygen, selenium is higher than sulfur, and tellurium is higher than selenium. Mixing the elements from group II and VI thus can give a compound having a lattice constant that is between silicon and germanium such that germanium will form less dislocations or no dislocation when being deposited on the II–VI compound intermediate layer. There are numerous potential mixtures of the II and VI elements to create a compound that has a lattice constant between that of silicon and germanium. A few examples of II–VI combination compounds that may have lattice constants between silicon and germanium include cadmium zinc sulfide selenide (CdZnSSe), zinc sulfide selenide ($ZnS_xSe_{1-x}$), and zinc sulfide telluride (ZnSTe).

Similar to the III–V compounds previously discussed, the II–VI compound intermediate layer can be a binary compound system (e.g., ZnSe, ZnS, MgSe, MgS, MgTe, BeSe, BeS, BeTe, and CdS, a ternary compound system (e.g., $ZnS_xSe_{1-x}$), or a quaternary compound system (e.g., CdZnSSe). In one embodiment, the germanium-containing layer 106 is a pure or substantially pure germanium layer. In one embodiment, elements from group II and the elements from group VI are chosen such that the combination of the II–VI compound should give a lattice constant between the lattice constant of silicon and the lattice constant of germanium.

The germanium-containing layer 106 is defect free or substantially defect free and containing substantially no dislocation. The transition of the intermediate layer 104 using the III–V or the II–VI combination elements ease the strain in the germanium-containing layer 106 that would otherwise be present due to the lattice mismatch between the semiconductor substrate 102 and the germanium-containing layer 106. In one embodiment, the germanium-containing layer 106 contains less than a defect density of $10^3$ defects per $cm^2$.

Figure 3:
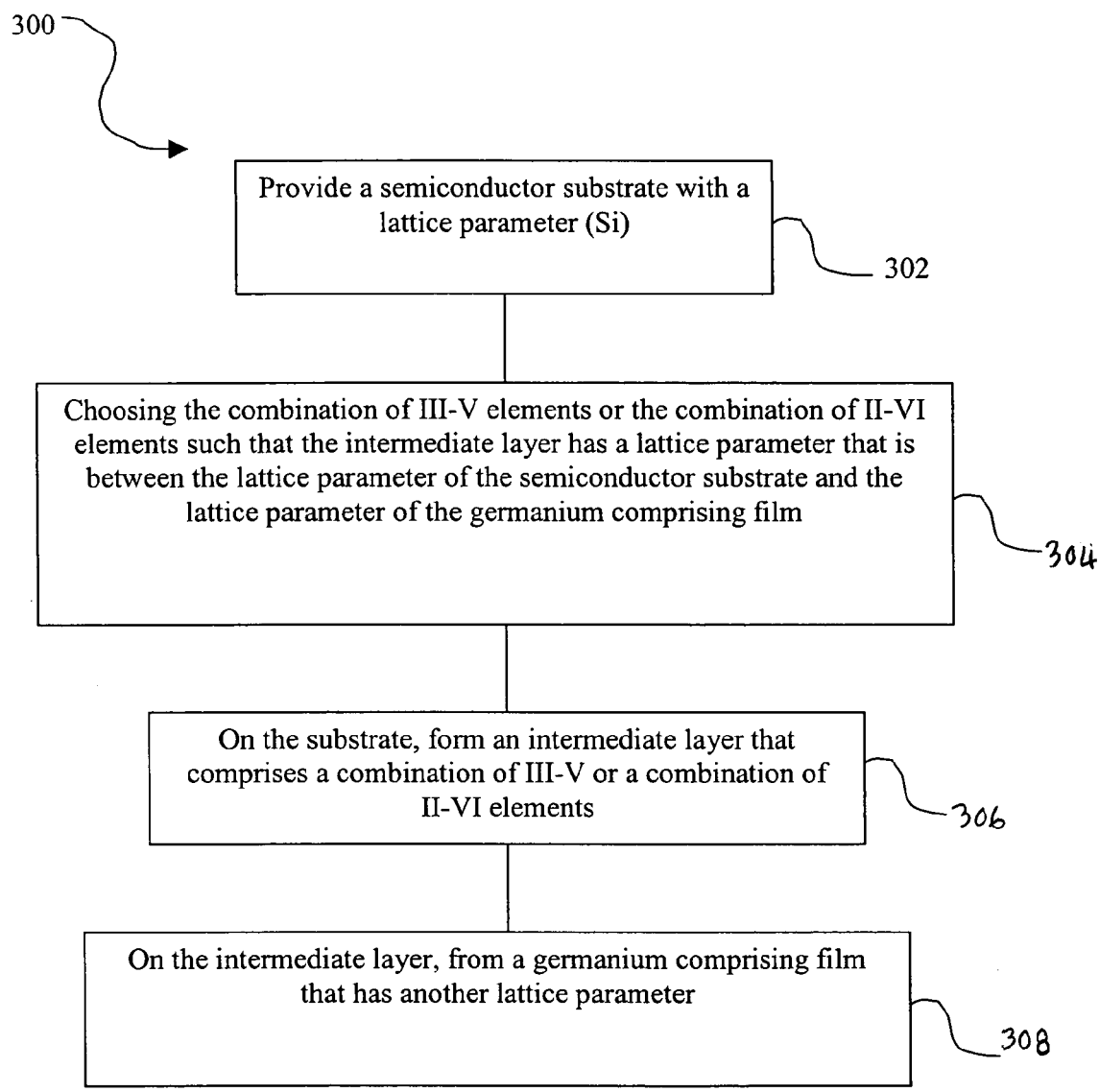
FIG. 3 illustrates an exemplary method of forming a germanium containing film is on a III-V or II-VI compound intermediate layer.

FIG. 3 illustrates an exemplary method 300 of making a semiconductor assembly that comprises a germanium-containing layer having substantially few or no dislocation defects. At box 302, a semiconductor substrate with a lattice constant (Si) is provided. At box 304, a combination of III–V elements or II–VI elements are chosen for the formation of an intermediate layer having a lattice constant that is between the lattice constant of the semiconductor substrate and the lattice constant of a germanium comprising film. At box 306, on the substrate, an intermediate layer that comprises a combination of III and V elements is formed. Alternatively, the intermediate layer that comprises a combination of II–VI elements is formed. At box 308, on the intermediate layer, a germanium-containing film that has a lattice constant is formed. The lattice constant for germanium can be higher than or equal to the lattice constant of the intermediate layer. It is to be noted that the III–V or II–VI element combination should be chosen prior to the forming of the intermediate layer.

In one embodiment, the substrate provided is a monocrystalline semiconductor substrate comprising silicon such as silicon wafer or silicon-on-insulator wafer. The substrate may be "bare," having no structure formed thereon or at least having a portion that has a bare surface. Other portions of the substrate may encompass other structures. The substrate or portions of the substrate typically is cleaned of native oxide, contaminants or other foreign material using methods known in the art. The intermediate layer is formed using methods such as molecular beam epitaxy (MBE), physical vapor deposition (PVD), or metal organic chemical vapor deposition (MOCVD). Other epitaxial processes may also be used in accordance with the embodiments of the present invention, for example, methods such as chemical vapor deposition (CVD), migration enhanced epitaxy (MEE), atomic layer epitaxy (ALE), chemical solution deposition (CSD), pulsed laser deposition (PLD), or the like, can be used. These processes are well known in the art. The intermediate layer can be formed using low temperature (e.g., 200–800° C.) and low pressure (e.g., $1.0 \times 10^{-10}$ Torr). In one embodiment, the intermediate layer is formed using a commercially available MBE deposition chamber. The intermediate layer can be formed by opening shutters in the MBE deposition chamber to expose the substrate to the particles selected from the periodic table group III and V or from the periodic table group II and VI. After the intermediate layer is formed, in one embodiment, to a thickness between about 0.3 nm to about 500 nm, the germanium-containing layer can be formed on top of the intermediate layer using methods such as CVD, MBE, or other suitable methods.

Figure 6:
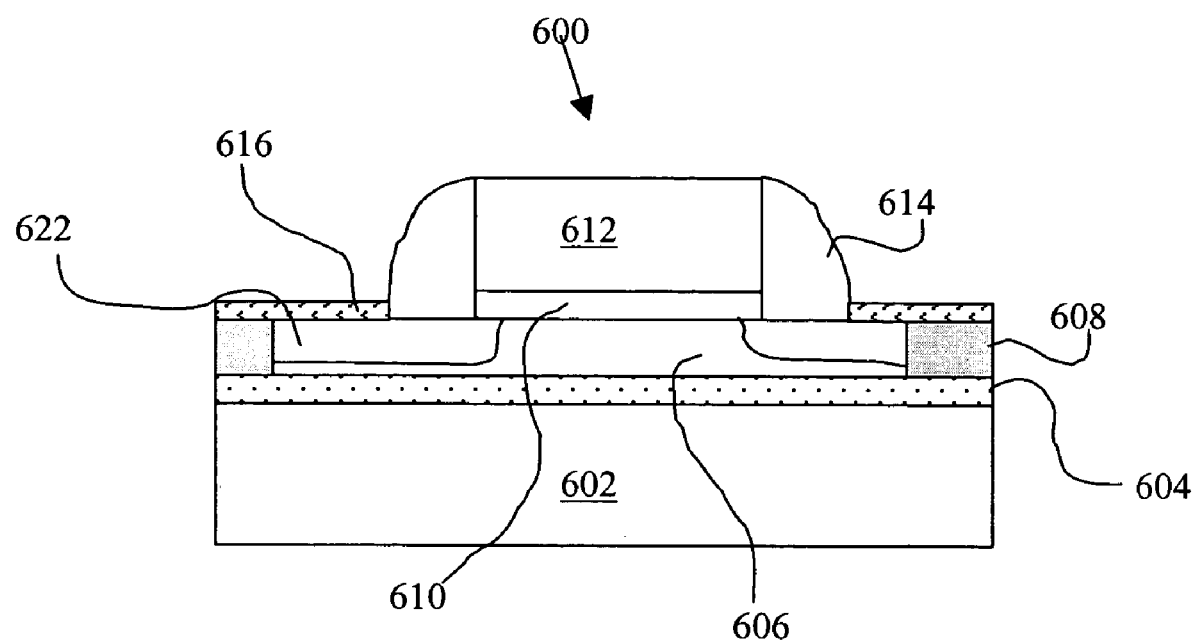
FIG. 6 illustrates an exemplary semiconductor device that incorporates the intermediate layer and the germanium-containing layer formed in accordance to embodiments of the present invention.

FIG. 6 illustrates an exemplary semiconductor device 600 that includes the intermediate layer and the germanium-containing layer in accordance to embodiments of the present invention. A substrate 602 (e.g., monocrystalline silicon or silicon-on-insulator) is provided. An intermediate layer 604 that comprises a III–V element combination or a II–VI element combination is formed on the substrate 602. A germanium-containing layer 606 is formed on the intermediate layer 604. The intermediate layer 604 has a lattice constant that is between the lattice constants of the substrate 602 and the germanium-containing layer 606. In one embodiment, the germanium-containing layer 606 is moderately doped (e.g., from about $1 \times 10^{15}$ per $cm^3$ to about $1 \times 10^{16}$ per $cm^3$). In one embodiment, the doping concentration is chosen to properly target the device threshold voltage. Shallow trench isolations 608 as shown in FIG. 6 may be formed in the germanium-containing layer 606 using conventional methods to insulate one device from another. In one embodiment, the shallow trench isolations 608 are first formed by a conventional etching method to first etch regions for the shallow trench isolation 608 and these regions are filled with an insulator, typically $SiO_2$. The etched region for the shallow trench isolation 608 can be of any suitable depth sufficient to remove most or all of the germanium from the shallow trench isolator 608. In one example, a conventional chemical mechanical polishing method may be used to polish the $SiO_2$ to ensure sufficient planarity.

Continuing with FIG. 6, a gate dielectric 610, a gate electrode 612, and spacers 614 can be formed on the top surface of the germanium-containing layer 606 using conventional methods (e.g., conventional film deposition and patterning). In one embodiment, the gate dielectric 610 can be deposited by a blanket deposition of a high-k oxide film. The deposition of the gate dielectric 610 is necessary since germanium does not form a stable oxide. In one embodiment, the gate dielectric 610 is made out of a high-k dielectric material such as zirconium oxide ($ZrO_2$). The gate electrode 612 can also be formed by a blanket deposition. The gate electrode 612 can be made out of a metal containing material, such as titanium nitride or tungsten, for a metal gate. The gate electrode 612 can be appropriately doped poly-Silicon such as for a conventional gate; or, the gate material can be a metal. In one example, after the gate dielectric 610 and the gate electrode 612 are blanket deposited over the germanium-containing layer 606, they are patterned to define the dimension of the gate dielectric 610 and the gate electrode 612. In one embodiment, the gate dielectric 610 and the gate electrode 612 are patterned in a single process. The spacers 614, typically comprise of a combination of $SiO_2$ and $Si_3N_4$, are also formed, first, by blanket deposition. And then, the spacers 614 are defined using conventional spacer etching method. Source and drain regions 622 may also be formed in the germanium-containing layer using conventional methods. The source and drain regions 622 may be heavily doped with a dopant concentration of $1 \times 10^{20}$ per $cm^3$.

In one embodiment, a nickel-germanium (NiGe) layer 616 may be formed on the germanium-containing layer 606 over the regions that are not covered with the gate dielectric 610 and the spacers 614. In one example, the NiGe is formed by a low-temperature annealing method using an annealing temperature of about 400° C. to about 600° C. Depositing a metal (e.g., nickel) that reacts with the material in a transistor body can substantially lower the resistivity of the source and drain contacts. Conventional methods are used to anneal the device 600 after all layers and components are formed. The annealing temperature for the device 600 comprising the germanium-containing layer 606 is kept low, 400° C. to about 600° C., to prevent the refractory metal from agglomerating, which tends to increase the resistivity of the source and drains regions and degrade the performance of the device 600. In one embodiment, the refractory metal used to anneal the device 600 comprising the germanium-containing layer 606 is nickel (Ni). Alternatively, another metal with low resistivity can be used.

Those skilled in the art will recognize that the features mentioned in FIG. 6 and other features may be used or may be left out, depending upon the particular function of the device. For example, after the formation of the NiGe, the device 600 is subjected to conventional processes of forming interlayer dielectric deposition, contact patterning, metalization, etc.

In some embodiments, devices made using the embodiments of the present invention that incorporate the III–V or II–VI element intermediate layer and the germanium-containing layer are incorporated into a computer system. Devices such as transistors, capacitors, resistors, sensors, optical elements, microprocessors, a central processing unit (CPU), memory structures, a power source, a display driver, display elements, and the like that are part of the computer system can be made to include the III–V or II–VI element combination intermediate layer (e.g., the device 600). The computer system may also include a memory device or structure to store, at least, temporarily, data and program; a mass storage device (e.g., a hard drive, a disk drive, a CD drive, or a DVD drive) to retain large amounts of data; an input device (e.g., a keyboard or a mouse) for entering data and instructions into the computer; an output device (e.g., a display screen); and a microprocessor including a CPU that executes the instructions for the computer system. The computer system may also include a main logic board. The computer system may further include a graphic controller chip for controlling the display apparatus of the computer system and which may communicate with the main logic board. Any one of the components of the computer system may include semiconductor devices that are made in accordance with embodiments of the present invention.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

What is claimed is:

1. An assembly comprising:
   a semiconductor substrate having a first lattice constant;
   an intermediate layer formed on the semiconductor substrate, the intermediate layer comprising a combination of II–VI elements, the intermediate layer having a second lattice constant; and
   a virtual substrate layer formed on the intermediate layer, the virtual substrate layer having a third lattice constant, wherein the virtual substrate layer is substantially defect-free; and wherein said intermediate layer is formed between said semiconductor substrate and said virtual substrate to relieve strain in the virtual substrate layer, and wherein the second lattice constant has a value that is approximately between the values of the first lattice constant and the third lattice constant;
   wherein the semiconductor substrate comprises silicon and the virtual substrate layer comprises germanium.

2. An assembly comprising:
   a silicon substrate having a first lattice constant;
   an intermediate layer formed on the silicon substrate, the intermediate layer comprising a combination of II–VI elements, the intermediate layer having a second lattice constant; and
   a germanium containing layer formed on the intermediate layer, the germanium containing layer having a third lattice constant, wherein the germanium containing layer is substantially defect-free; and wherein said intermediate layer is formed between said silicon substrate and said germanium containing layer to relieve strain in the germanium containing layer, and wherein the second lattice constant has a value that is approximately between the values of the first lattice constant and the third lattice constant.

3. A semiconductor assembly:

a silicon containing substrate having a first lattice constant;

an intermediate layer formed on the silicon containing substrate, the intermediate layer comprising a combination of II–VI elements, the intermediate layer having a second lattice constant; and a germanium containing layer formed on the intermediate layer, the germanium containing layer having a third lattice constant, wherein the germanium containing layer is substantially defect-free; and wherein the intermediate layer is formed between the silicon containing substrate and the germanium containing layer to relieve strain in the germanium containing layer, and wherein the second lattice constant has a value that is approximately between the values of the first lattice constant and the third lattice constant.

4. The assembly of claim 3 wherein the silicon containing substrate is one of a monocrystalline silicon substrate, a polycrystalline silicon substrate, and a silicon-on-insulator substrate.

5. The assembly of claim 3 wherein the first lattice constant is about 5.43 angstroms, the third lattice constant is about 5.65 angstroms, and the second lattice constant is approximately between about 5.43 and about 5.65 angstroms.

6. The assembly of claim 3 wherein the intermediate layer comprises more than one Group II elements and more than one Group VI elements.

7. The assembly of claim 3 wherein the germanium containing layer is a monocrystalline germanium layer.

8. The assembly of claim 3 wherein a semiconductor device including trench isolations, a gate dielectric, a gate electrode and spacers is formed on the germanium containing layer and the germanium containing layer is substantially defect free.

9. The assembly of claim 3 wherein the intermediate layer is any one of a binary system compound, a ternary system compound, and a quaternary system compound.

10. A method comprising:

providing a semiconductor substrate having a first lattice constant;

forming an intermediate layer on the substrate, the intermediate layer comprising a combination of II–VI elements, the intermediate layer having a second lattice constant; and forming a germanium containing layer on the intermediate layer, the germanium-containing layer having a third lattice constant, wherein the germanium containing layer is substantially defect free, wherein the forming the intermediate layer further comprises choosing at least one element from a group II element and choosing at least one element from a group VI element such that the combination of II–VI elements yields the second lattice constant that is approximately between the values of the first lattice constant and the third lattice constant, and wherein forming the intermediate layer further comprises varying a composition of the elements from the groups II and VI to achieve said second lattice constant.

11. The method of claim 10, further comprises forming a semiconductor device on the germanium containing layer including forming trench isolations, a gate dielectric, a gate electrode and spacers for said semiconductor device.

12. The method of claim 10 wherein the intermediate layer is any one of a binary system compound, a ternary system compound, and a quaternary system compound.

13. The method of claim 10 wherein the intermediate layer has one of a diamond cubic crystal structure and a zincblende crystal structure.

14. The method of claim 10, further comprises grading the intermediate layer such that the lattice value increases from a lattice value similar to the first lattice constant to a lattice value similar to the third lattice constant.

* * * * *